(12) United States Patent
Kim (10) Patent No.: US 7,378,794 B2
(45) Date of Patent: May 27, 2008

(54) STRUCTURES FOR COUPLING AND GROUNDING A CIRCUIT BOARD IN A PLASMA DISPLAY DEVICE

(75) Inventor: Myoung-Kon Kim, Asan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 347 days.

(21) Appl. No.: 10/948,667

(22) Filed: Sep. 24, 2004

(65) Prior Publication Data

US 2005/0079748 A1    Apr. 14, 2005

(30) Foreign Application Priority Data

Oct. 10, 2003    (KR) ...................... 10-2003-0070595

(51) Int. Cl.
*H01J 17/49*    (2006.01)
*H05K 7/04*    (2006.01)
*H05K 5/02*    (2006.01)
*H02B 1/00*    (2006.01)

(52) U.S. Cl. ..................... 313/582; 361/681; 361/688; 361/600; 361/809; 361/810; 313/583

(58) Field of Classification Search ................ 313/513; 439/92; 361/681, 688

See application file for complete search history.

(56) References Cited

FOREIGN PATENT DOCUMENTS

| JP | 61-57594 | 4/1986 |
|---|---|---|
| JP | 1-150375 | 10/1989 |
| JP | 5-62078 | 8/1993 |
| JP | 10319863 A * | 12/1998 |
| JP | 2003-043942 | 2/2003 |
| JP | 2003-243855 | 8/2003 |
| JP | 2003243855 A * | 8/2003 |
| KR | 10-1999-0029379 | 7/1999 |

OTHER PUBLICATIONS

English translation of Japanese Utility 61-057594.*
Korean Office Action of the Korean Patent Application No. 10-2003-0070595, mailed on Feb. 16, 2006.
Japanese Office Action for corresponding Korean Patent Application No. 2003-70595, issued on Sep. 12, 2006.

* cited by examiner

*Primary Examiner*—Mariceli Santiago
*Assistant Examiner*—Natalie K. Walford
(74) *Attorney, Agent, or Firm*—Robert E. Bushnell, Esq.

(57) ABSTRACT

A coupling and grounding structure of a plasma display device for grounding a circuit board effectively, and fixing the circuit board stably. The plasma display device includes a plasma display panel having a display area, on which images are displayed; a chassis base coupled to a back surface of the plasma display panel; at least one circuit board, on which at least one electronic element for driving the plasma display panel is mounted, the circuit board having a conductive portion and at least one coupling hole to be coupled to the chassis base by a bolt member penetrating the coupling hole; and at least a conductive member which contacts the conductive portion and the bolt member in the coupling hole.

21 Claims, 11 Drawing Sheets

STRUCTURES FOR COUPLING AND GROUNDING A CIRCUIT BOARD IN A PLASMA DISPLAY DEVICE

CLAIM OF PRIORITY

This application makes reference to, incorporates the same herein, and claims all benefits accruing under 35 U.S.C §119 from an application entitled PLASMA DISPLAY DEVICE HAVING STRUCTURES FOR COUPLING AND GROUNDING OF CIRCUIT BOARD earlier filed in the Korean Industrial Property Office on 10 Oct. 2003, and there duly assigned Serial No. 2003-70595 by that Office.

BACKGROUND OF THE INVENTION

1. Field of the Invention

The present invention relates to a plasma display panel (PDP), and more particularly, to coupling and grounding structures of a circuit board in a plasma display device.

2. Description of the Related Art

In general, a plasma display panel (PDP) displays images using gas discharge operations, and has excellent display characteristics such as display capacity, brightness, contrast, residual image, and viewing angle. Thus, the PDP can substitute for a cathode ray tube (CRT). In the PDP, a discharge occurs in a gas between electrodes due to a direct current (DC) or alternating current (AC) being applied to the electrodes, and phosphors are excited by ultraviolet rays caused by the discharge operation and emit lights.

The PDP can be classified into an AC type and a DC type according to a discharge mechanism thereof. The DC type PDP includes the electrodes that are directly exposed in the gas layer filled in discharge cells, and voltage applied to the electrodes is applied to the discharge gas layer. In addition, in the AC type PDP, electrodes are separated by both the discharge gas layer and a dielectric layer, the electrodes do not absorb charged particles generated in the discharge operation to form wall charges, and the discharge operation is performed using the wall charge.

In the general PDP, the panel is attached to a chassis base while interposing a heat-radiation sheet having thermal conductivity. In addition, a circuit board, on which a plurality of electronic elements are mounted, is coupled to a boss that is formed on the chassis base. The circuit board is coupled to the boss using bolts by arranging a plurality of coupling holes that are formed on the circuit board with the boss. Therefore, the bolts must be coupled tightly.

I have determined that in such a case, the circuit board may be damaged or distorted due to the bolts being over tightened. Additionally, the bolts may be loosened during thermal distortion or vibration of the circuit board. Accordingly, the grounding is performed poorly. Also, if the grounding of the circuit board is performed poorly, current and voltage noises cannot be controlled effectively, and electromagnetic interference (EMI) characteristics will be lowered.

SUMMARY OF THE INVENTION

The present invention provides a plasma display device having coupling and grounding structures that can effectively ground a circuit board, and stably fix the circuit board to a chassis of the plasma display device.

According to an aspect of the present invention, there is provided a plasma display device including: a chassis base coupled to a back surface of a plasma display panel having a display area; at least a circuit board, on which at least one electronic element for driving the plasma display panel is mounted, including a conductive portion and at least one coupling hole to be coupled to the chassis base by a bolt member penetrating the coupling hole; and at least a conductive member which contacts the conductive portion and the bolt member in the coupling hole.

According to another aspect of the present invention, there is provided a plasma display device including: a chassis base coupled to a back surface of a plasma display panel having a display area; at least a circuit board, on which at least one electronic element for driving the plasma display panel is mounted, including a conductive portion and at least one coupling hole to be coupled to the chassis base by a bolt member penetrating the coupling hole; and at least a conductive member that contacts the conductive portion and the bolt member and has a guide unit inserted into a portion of the chassis base, to which the circuit board is coupled. The chassis base further includes a coupling recess corresponding to the guide unit on the portion where the circuit board is coupled.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
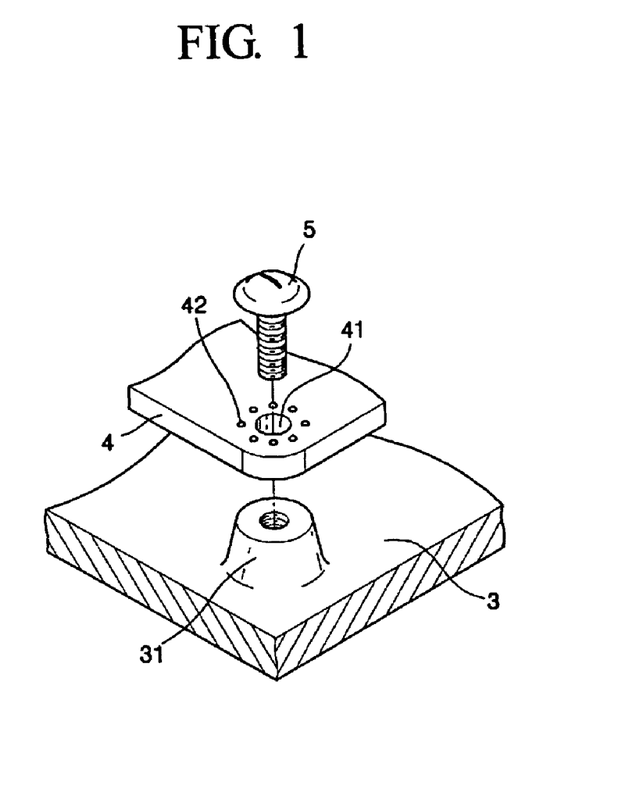
FIG. 1 is a partially exploded perspective view showing an example of a coupling structure of a circuit board and a boss unit.

Shown in FIG. 1 is a plurality of soldering units 42 for grounding formed around a coupling hole 41 for bolt member 5. Circuit board 4 is grounded to a chassis base 3 through a boss 31 as shown in FIGS. 1 and 2.

Figure 2:
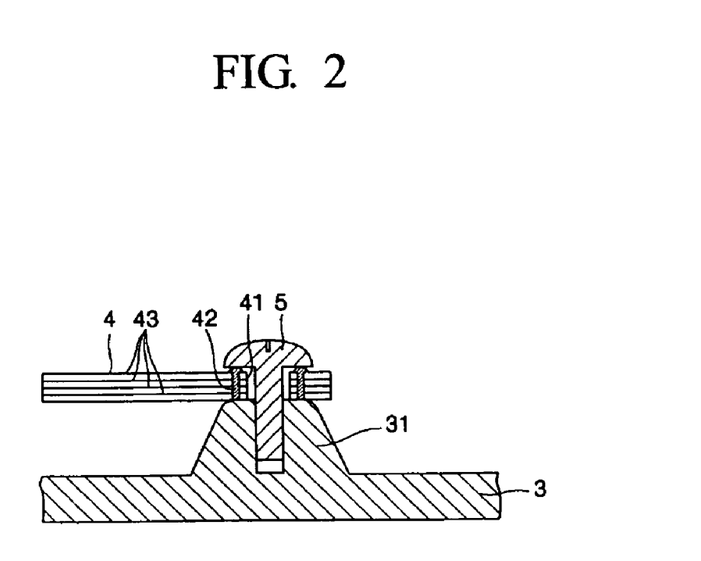
FIG. 2 is a cross-sectional view showing the structure of FIG. 1.

The soldering units 42 penetrate circuit board 4 as shown in FIG. 2. In general, the circuit board 4 has a multi-layered structure, and a plurality of circuit ground wires 43 are built-in the cross section of the board. The soldering units 42 penetrate the ground wires 43, and upper end portions of the soldering units 42 are exposed on outer upper side of the circuit board 4.

As shown in FIG. 2, the head of the coupling bolt member 5 contacts the soldering units 42 to form a ground. That is, the ground wires 43 of the circuit board 4 are grounded to the chassis base 3 through the soldering units 42 and the bolt member 5.

In the above grounding structure, however, since the soldering units 42 protrude on the upper surface of the circuit board 4, the bolt member 5 should be coupled to the soldering units 42 tightly in order to ground the soldering units 42. If the bolt member 5 is coupled to the soldering units 42 loosely, the bolt member 5 may not contact some of the soldering units 42. Therefore, the bolt member 5 must be coupled tightly. In this case, the circuit board 4 may be damaged or distorted, and thus the bolt member 42 may be loosened during thermal distortion or vibration of the circuit board 4. Accordingly, the grounding is performed poorly. In addition, if the grounding of the circuit board 4 is performed poorly, current and voltage noises cannot be reduced effectively, and electromagnetic interference (EMI) characteristics may be lowered.

Figure 3:
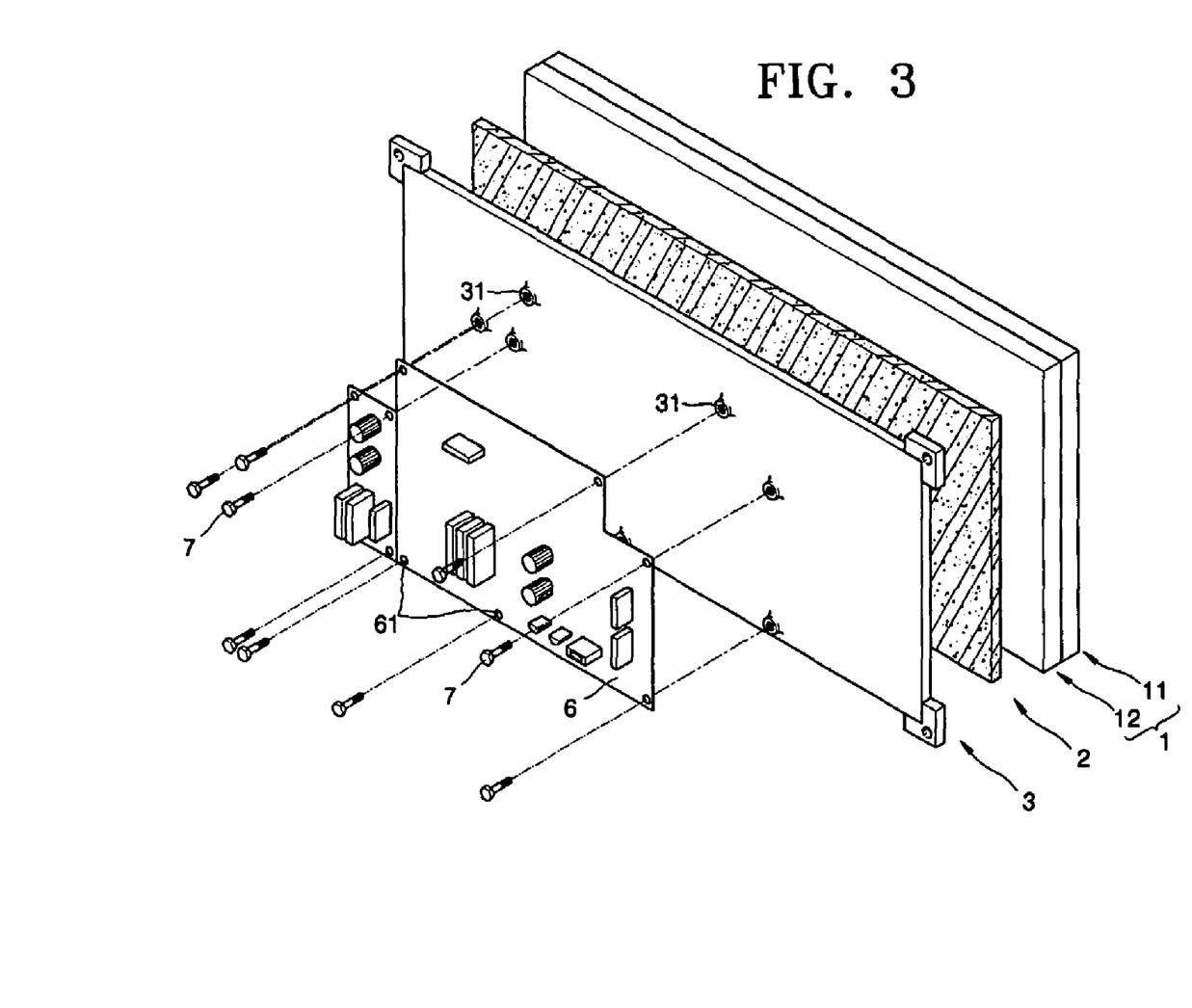
FIG. 3 is an exploded perspective view showing a plasma display device according to the principles of the present invention.

FIG. 3 is a partially exploded perspective view showing a plasma display device according to an embodiment of the present invention.

Referring to FIG. 3, the plasma display device of the present invention includes a plasma display panel (PDP) 1 having a first substrate 11 and a second substrate 12 formed of a transparent glass material. The PDP 1 is fixedly attached to a chassis base 3, and a heat radiation sheet 2 that is formed of a thermal conductive material may further be disposed between the PDP 1 and the chassis base 3. In addition, at least one or more circuit boards 6, on which various electronic elements for driving the PDP 1 are mounted, are coupled to the chassis base 3. The PDP 1 coupled to the chassis base 3 is received in an additional case (not shown), and a filter member may be further coupled to a front surface of the PDP 1.

In the present invention, the PDP 1 can be any type of PDP, for example, an alternating current (AC) type surface discharge PDP can be used as the PDP 1.

On the other hand, the circuit board 6 that is coupled to the chassis base 3 includes at least one or more coupling holes 61. In addition, bolt members 7 penetrate the coupling holes 61 to be coupled to chassis base 3, and accordingly, the circuit board 6 is fixedly coupled to the chassis base 3.

In an embodiment of the present invention, the chassis base may include boss units 31 corresponding to the coupling holes 61, and the bolt members 7 can be coupled to the boss units 31. However, the coupling structure is not limited to above described structure, and any type of structure can be used if it fixes the circuit board 6 by coupling the bolt members 7 to the chassis base 3.

In addition, it is desirable that the bolt member 7 is formed of a conductive material for grounding the circuit board 6. Also, various kinds of coupling members can be used, for example, a rivet can be used as the coupling member instead of bolt member 7.

Figure 4:
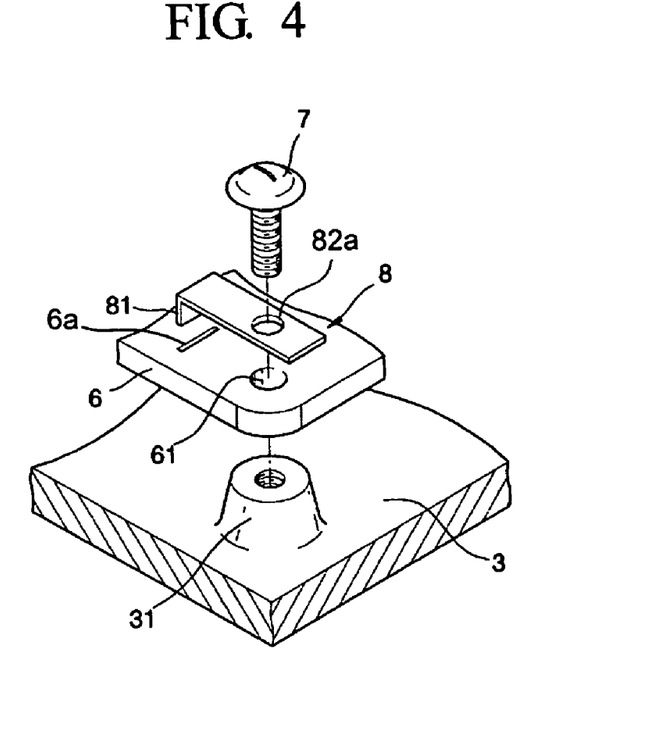
FIG. 4 is a perspective view showing a coupling structure of a circuit board and a chassis base according to a first embodiment according to the principles of the present invention.
Figure 5:
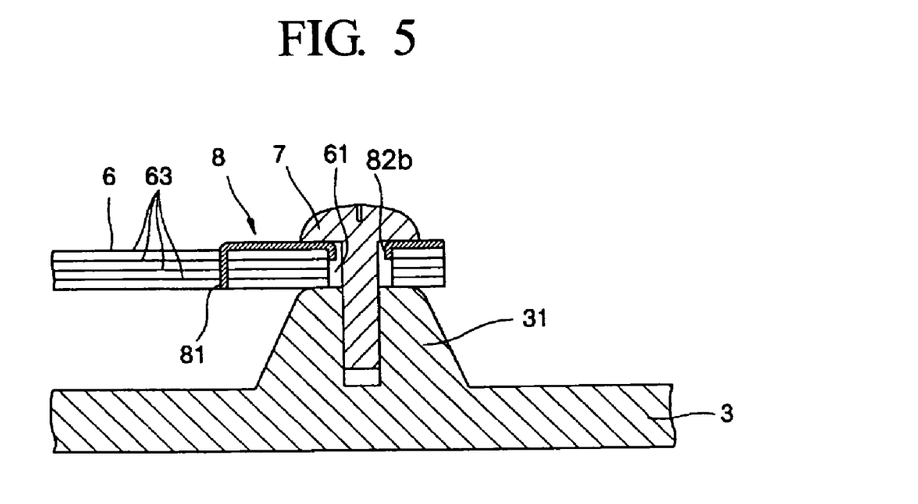
FIG. 5 is a cross-sectional view showing the structure of FIG. 4.

On the other hand, as shown in FIGS. 4 and 5, the bolt member 7 is coupled to the circuit board 6 after interposing an additional conductive member 8 therebetween. The conductive member 8 can be formed of a conductive material such as aluminum, and nickel can be plated on the surface of the conductive member 8 for reinforcing the strength. In addition, according to the present invention shown in FIGS. 4 and 5, the conductive member 8 includes a ground portion 81 that is inserted through a slot 6a into the circuit board 6 in a thickness direction thereof, and a supporting portion 82a that surrounds the coupling hole 61.

The circuit board 6 can be formed in a multi-layered structure, and a conductive portion 63 is disposed on each layer. The conductive portion 63 should be completely grounded onto the chassis base 3 to reduce current noise and voltage noise of the plasma display device, and to prevent the operating errors.

Therefore, as shown in FIG. 5, the additional conductive member 8 can be disposed for the grounding. The conductive member 8 is formed as a flat plate as shown in FIG. 4, and includes a grounding portion 81 on an end portion thereof so that the grounding portion 81 is inserted into the circuit board 6 in the thickness direction thereof and contacts the conductive portions 63 in the circuit board 6. The supporting portion 82a is formed to surround the coupling hole 61 on a portion corresponding to the coupling hole 61. The supporting portion 82a is also formed by perforating a hole, having a smaller diameter than that of the coupling hole 61, through the conductive member 8 of plate type, and a circumferential portion of the hole is bent during a burring operation so as to form a bent portion 82b that engages and is inserted into the coupling hole 61. In addition, the bolt member 7 is coupled to the supporting portion 82a and coupled to the boss unit 31.

When the conductive member 8 of plate type and the grounding portion 81 disposed on the end portion of the conductive member 8 are inserted into the circuit board 6 according to the present invention, the total area that the conductive portion 63 of the circuit board 6 and the bolt member 7 are in contact can be increased, thus the grounding can be performed completely. Also, when the bolt member 7 is coupled to the boss unit 31, the bolt member 7 and the supporting portion 82a can have an increased area of contact, thus the force exerted by tightening bolt member 7 can be evenly distributed which lowers pressure exerted on circuit board 6 at coupling hole 61. Accordingly, the distortion or damage of the circuit board 6 can be prevented, and the bolt member 7 is not loosened.

Figure 6:
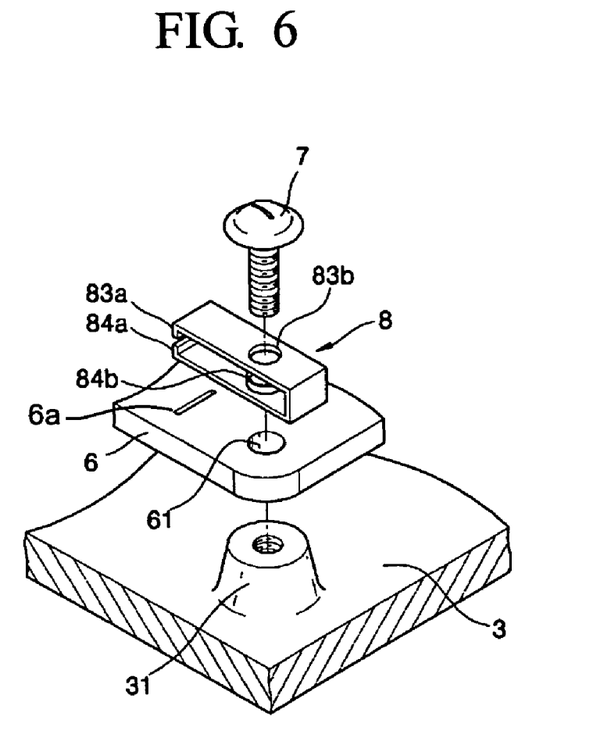
FIG. 6 is a perspective view showing a coupling structure of a circuit board and a chassis base according to a second embodiment according to the principles of the present invention.
Figure 7:
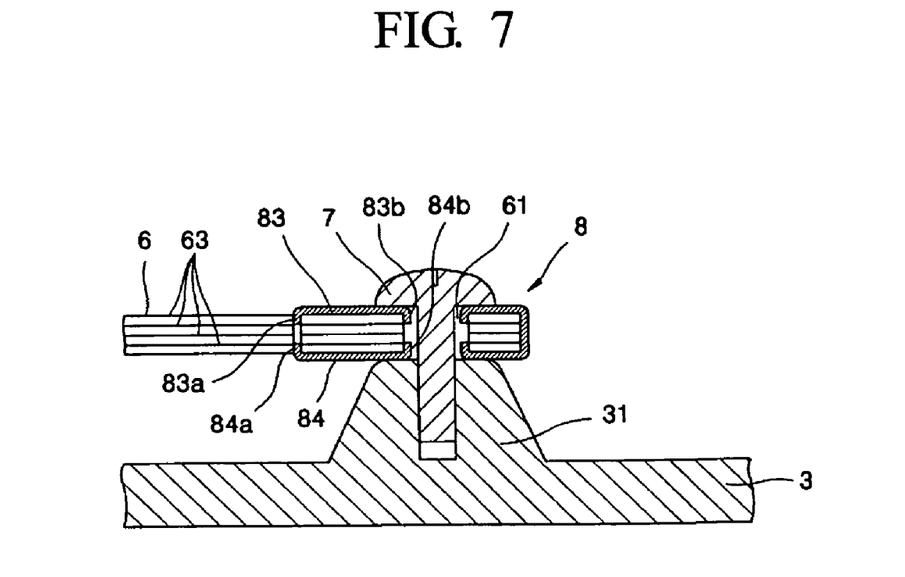
FIG. 7 is a cross-sectional view showing the structure of FIG. 6.

FIGS. 6 and 7 show a conductive member according to another embodiment of the present invention, the conductive member 8 includes a first conductive member 83 that is coupled on the upper surface of the circuit board 6, and a second conductive member 84 that is disposed on a lower surface of the circuit board 6, that is, a surface facing the chassis base 3.

The conductive member 8 including the first and second conductive members 83 and 84 also electrically connects the conductive portion 63 of the circuit board 6 and the bolt member 7 in order to perform a grounding.

As shown in FIGS. 6 and 7, the first conductive member 83 and the second conductive member 84 can be connected at end portions thereof. Therefore, the conductive member 8 can be formed to be longer than that of FIGS. 4 and 5, and bent around the coupling hole 61 of the circuit board 6 to form the connected first and second conductive members 83 and 84.

The first and second conductive members 83 and 84 also respectively include first and second grounding portions 83a and 84a that are inserted through slot 6a into the circuit board 6 in the thickness direction of the circuit board, and first and second supporting portions 83b and 84b that surround and extend into the coupling hole 61.

When the conductive member 8 is formed to have the first and second conductive members 83 and 84, the area of contact between the circuit board 6 and the conductive portion 63 increases, and thus improve the grounding capacity. In addition, since the first and second conductive members 83 and 84 are connected to each other, the distortion of the circuit board 6 can be limited when the bolt member 7 couples the circuit board 6 to chassis 3.

Figure 8:
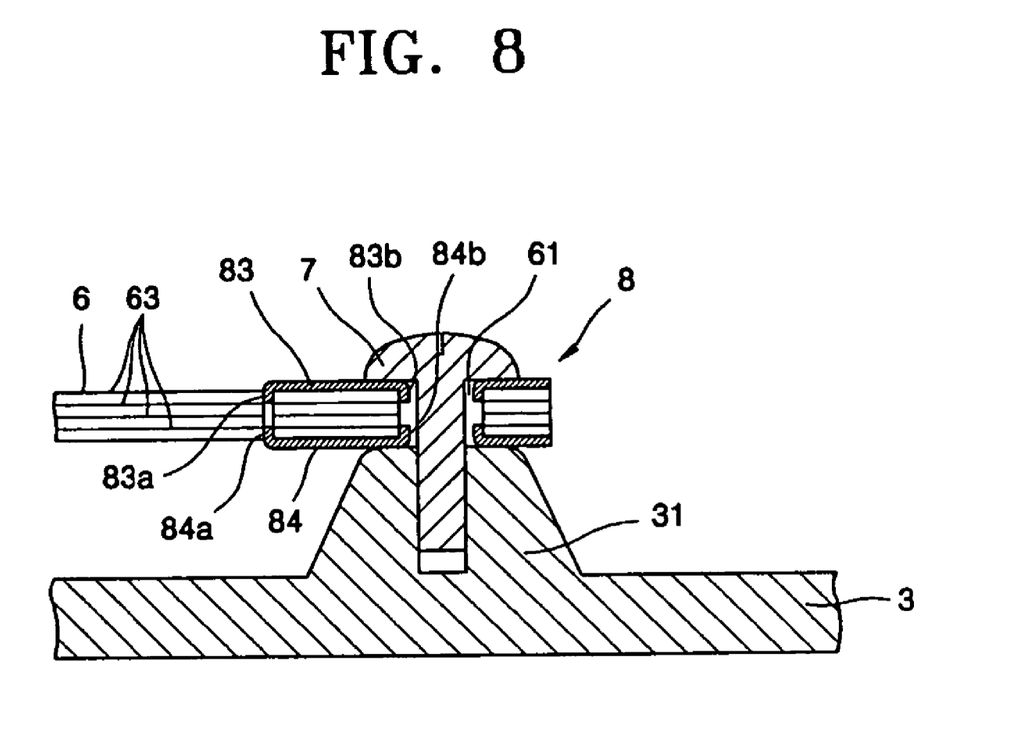
FIG. 8 is a cross-sectional view showing a modified example of the structure shown in FIG. 6.

The structure including the first and second conductive members 83 and 84 is not limited to the above described structure, and the first and second conductive members 83 and 84 may not be connected to each other, as shown in FIG. 8.

Figure 9:
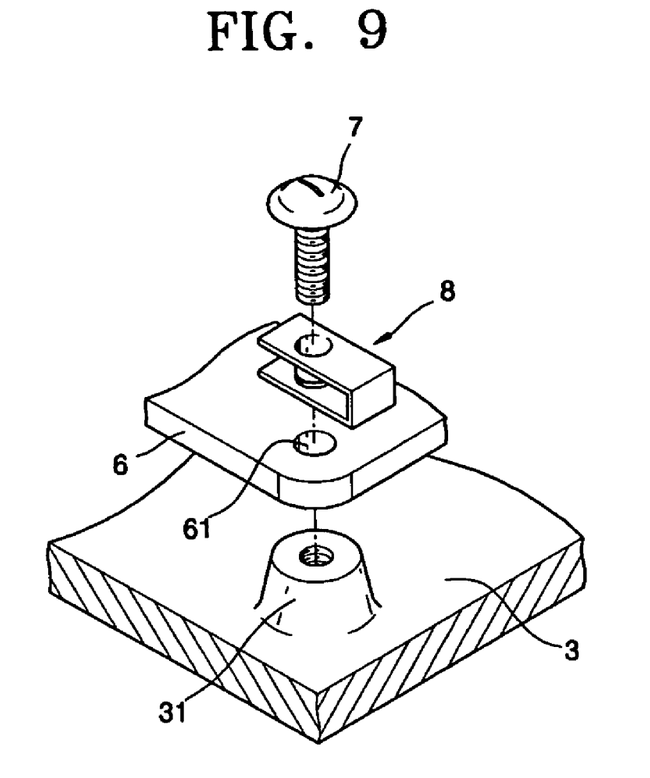
FIG. 9 is a perspective view showing a coupling structure of a circuit board and a chassis base according to a third embodiment according to the principles of the present invention.
Figure 10:
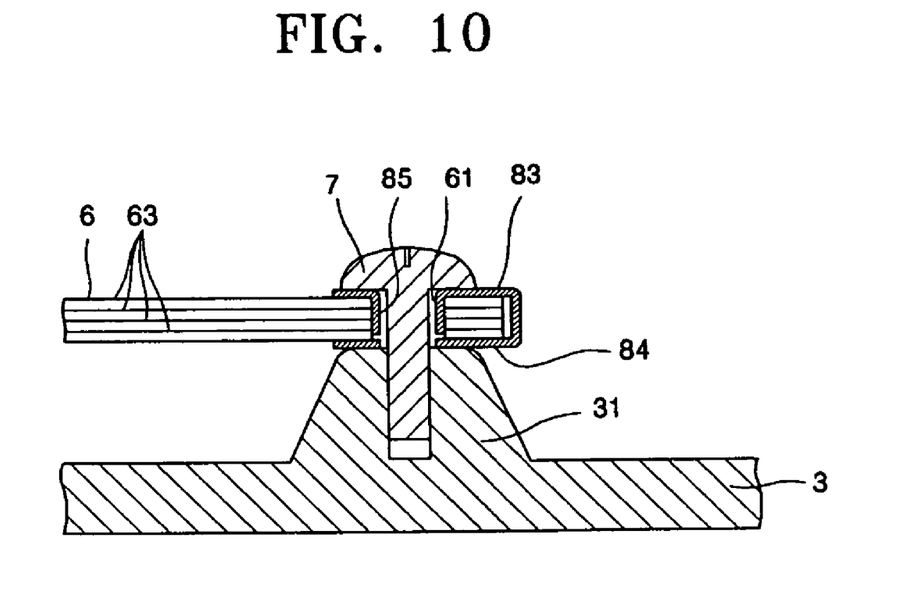
FIG. 10 is a cross-sectional view showing the structure of FIG. 9.

Alternatively, as shown in FIGS. 9 and 10, in a state where the first and second conductive members 83 and 84 are connected to each other, the first conductive member 83 can include a penetration grounding portion 85 that is inserted into the coupling hole 61 and extends nearly all the way through coupling hole 61. The penetration grounding portion 85 is formed to contact conductive portion 63 at the inner surface of the coupling hole 61 to increase the contacting area of the circuit board 6 with the conductive member 8. Accordingly, the grounding reliability of the circuit board 6 to the chassis base 3 can be improved more. Since the first and second conductive members 83 and 84 are connected to each other, the distortion of the circuit board 6 can be prevented more effectively.

Figure 11:
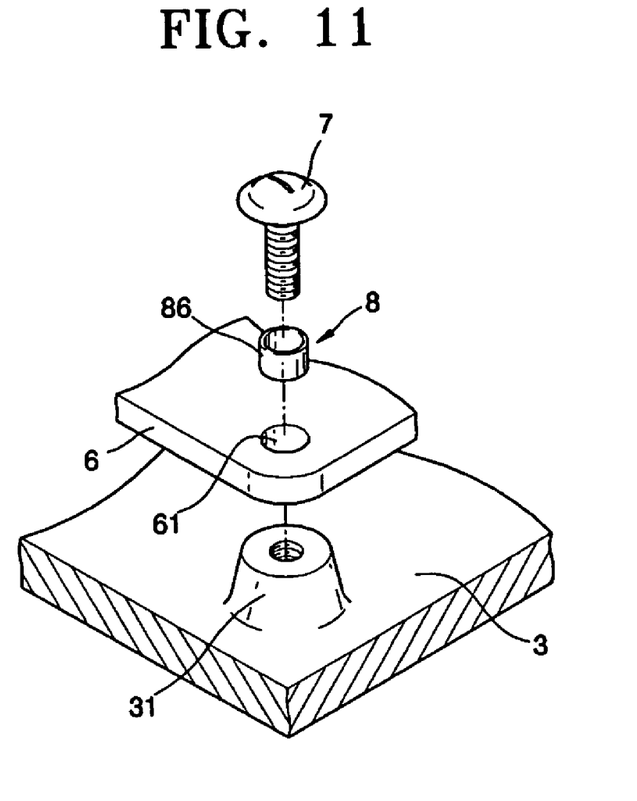
FIG. 11 is a perspective view showing a coupling structure of a circuit board and a chassis base according to a fourth embodiment according to the principles of the present invention.
Figure 12:
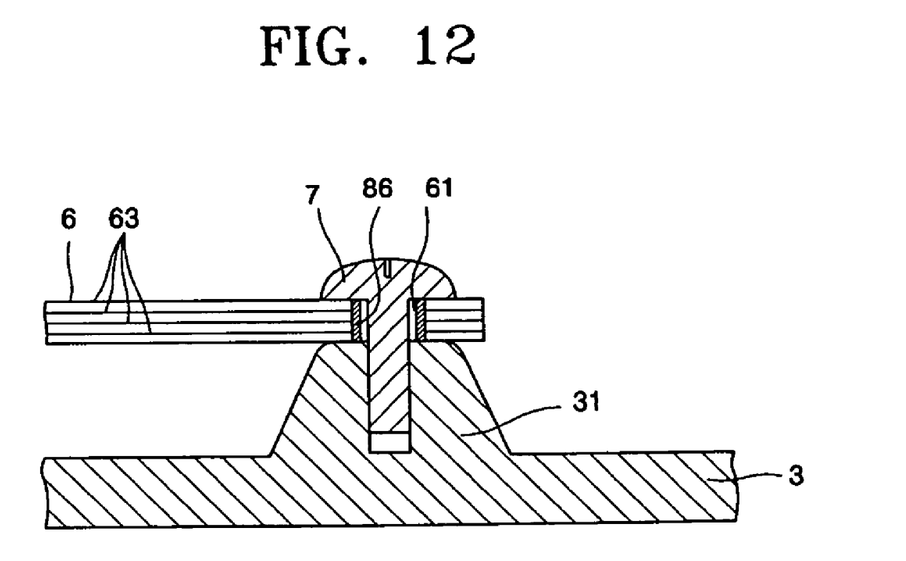
FIG. 12 is a cross-sectional view showing the structure of FIG. 11.

FIGS. 11 and 12 show a conductive member 8 according to still another embodiment of the present invention. As shown in FIGS. 11 and 12, the conductive member 8 can be formed as a conductive tube 86, an outer circumferential surface of which contacts the inner surface of the coupling hole 61. In this case, an outer diameter of the conductive tube 86 is formed to be slightly less than an inner diameter of the coupling hole 61. In addition, a length of the conductive tube 86 is formed to be equal to the thickness of the circuit board 6.

Accordingly, the conductive tube 86 electrically contacts the conductive portion 63 of the circuit board 6 through the inner surface of the coupling hole 61, and an upper portion or a lower portion of the conductive tube 86 contacts the bolt member 7 and is grounded to the chassis base 3. Therefore, the grounding area is increased by the conductive tube 86, and the distortion of the circuit board 6 is eliminated to reduce the risk of the bolt member 7 of being loosened.

Figure 13:
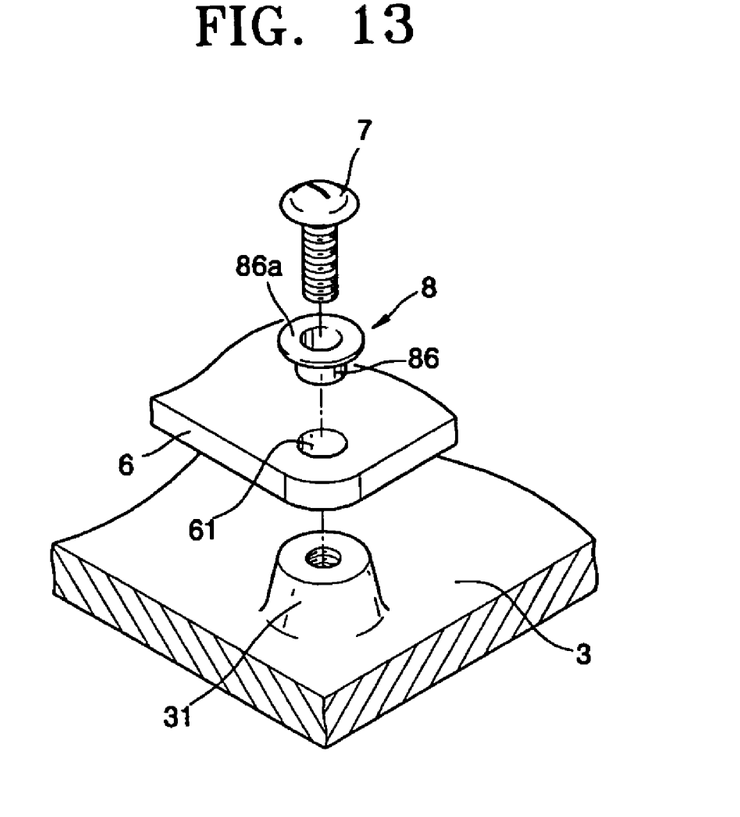
FIG. 13 is a perspective view showing a coupling structure of a circuit board and a chassis base according to a fifth embodiment according to the principles of the present invention.
Figure 14:
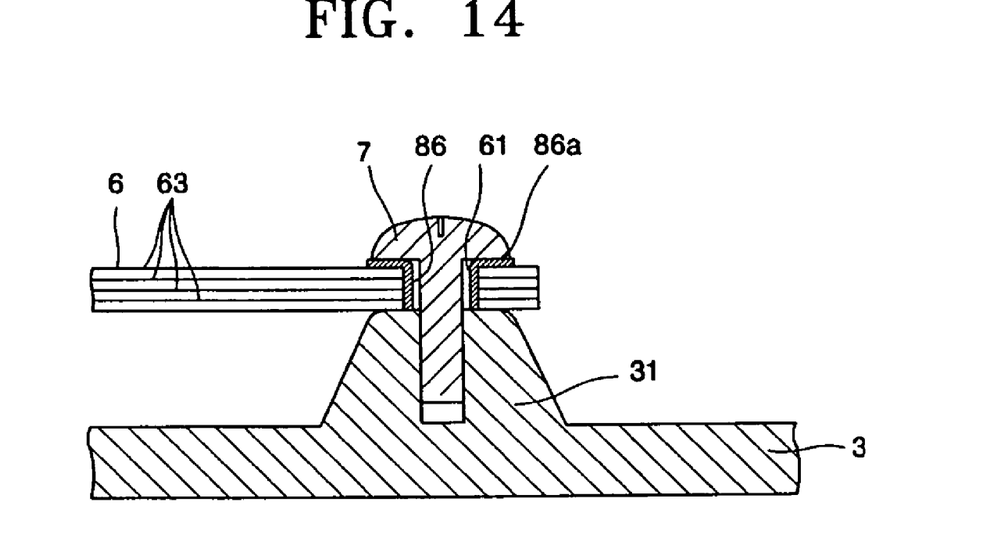
FIG. 14 is a cross-sectional view showing the structure of FIG. 13.

As shown in FIGS. 13 and 14, the conductive tube 86 may include a flat portion, hereafter, flange portion 86a, on a portion contacting the head of bolt member 7. The flange portion 86a can be formed by expanding an upper portion of the tube 86 and bending the expanded portion. The flange portion 86a can increase the area of contact between the circuit board 6 and the bolt member 7, and the bolt member 7 can be coupled to the circuit board 6.

Figure 15:
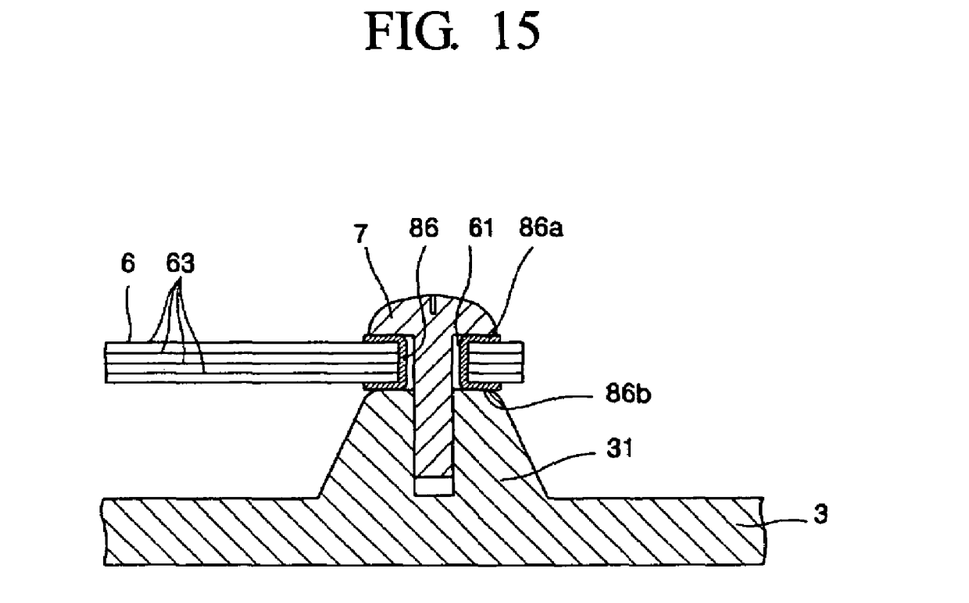
FIG. 15 is a cross-sectional view showing a modified example of the structure shown in FIG. 13.

The conductive tube 86 can further include a second flange portion 86b on an opposite end of tube 86 from flange portion 86a, flange portion 86b contacting to boss unit 31 of the chassis base 3 as shown in FIG. 15. The flange portion 86b can be formed by elongating the conductive tube 86, expanding the upper and lower portions of the tube 86, and bending the expanded portions, characterized in that the outer surface area of tube 86 between flange portions 86a and 86b is equal to the thickness of circuit board 6. When the flange portions are formed on both end portions of conductive tube 86, the contacting area of the conductive tube 86b with bolt member 7 and boss unit 31 increases the grounding efficiency of the circuit board 6 and coupling the bolt member 7 while reducing the risk of distorting the circuit board 6.

On the other hand, according to the present invention, a guide unit that is inserted into the boss 31 of chassis base 3 can be further formed on a portion of the conductive member 8, which is coupled to the chassis base 3, and a coupling recess corresponding to the guide unit can be formed in boss 31 on the coupling portion of the chassis base 3 so that the circuit board 6 and the chassis base 3 can be coupled to each other more firmly.

Figure 16:
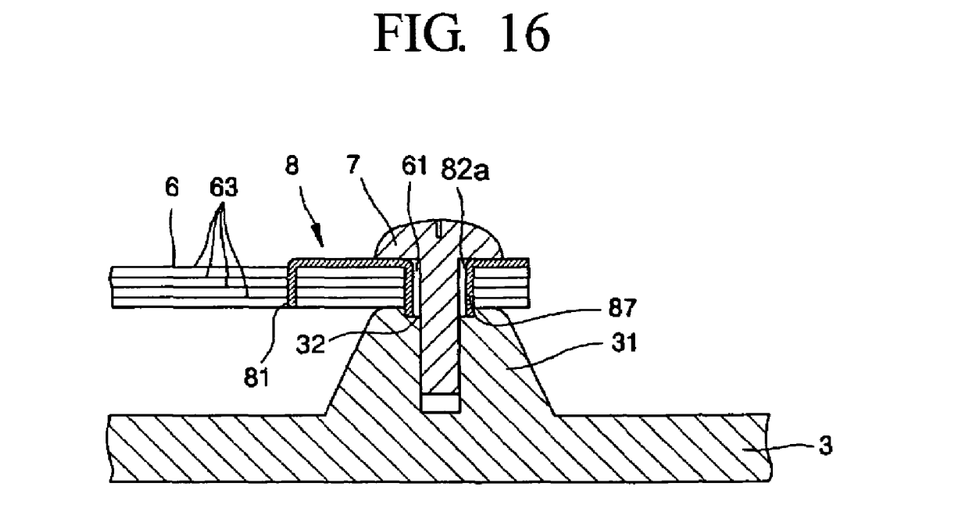
FIGS. 16 through 19 are cross-sectional views showing the coupling structures of different embodiments according to the principles of the present invention.

That is, as shown in FIG. 16, as compared to FIG. 5, it is desirable that a guide unit 87 extends from the supporting portion 82a that surrounds the coupling hole 61, and a coupling recess 32 is formed in the boss unit 31 so as to correspond to the guide unit 87 in the structure of the conductive member 8. Note that the upper surface of boss 31 remains in contact with a bottom surface of circuit board 6 to ensure a tight fit.

Figure 17:
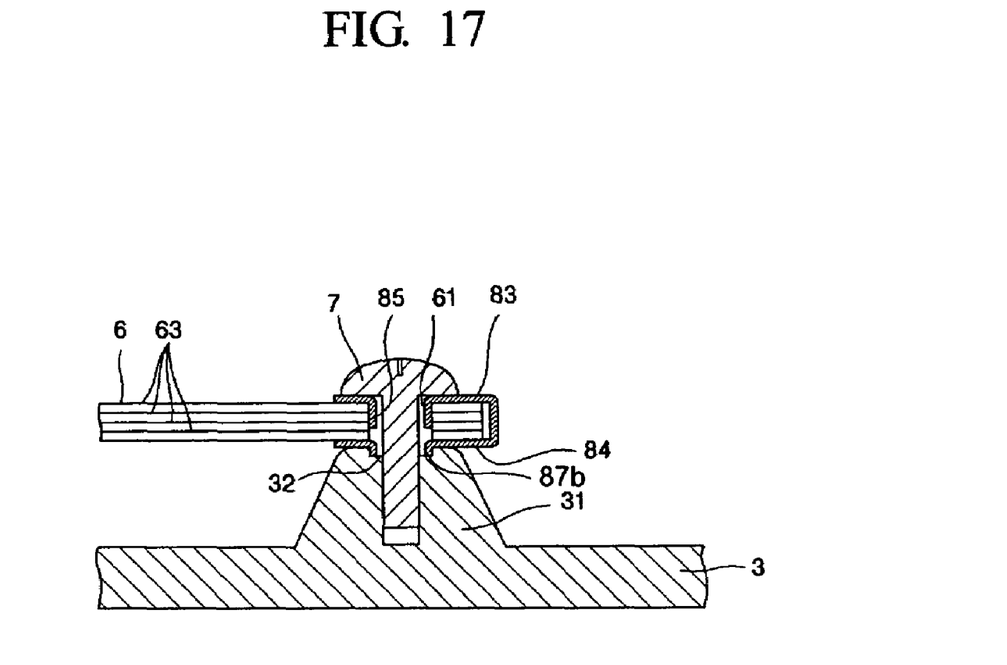

An embodiment of the invention in FIG. 17, as compared to the embodiment shown in FIG. 10, shows a guide unit 87b can be formed by bending an extended portion of the second conductive member 84. In this case, coupling recess 32 in boss 31 is provided corresponding to the guide unit 87b.

Figure 18:
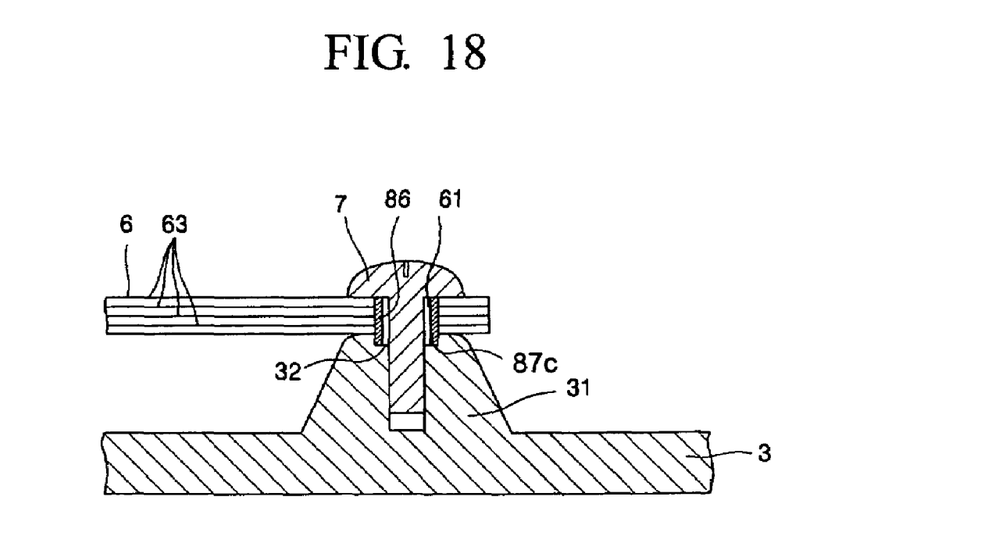

In addition, an embodiment of the invention in FIG. 18, as compared to the embodiment shown in FIG. 12, shows a guide unit 87c can be formed by extending an end portion of the conductive tube 86, which faces the boss unit 31, and inserting the guide unit 87c into the coupling recess 32 of the boss unit 31.

Figure 19:
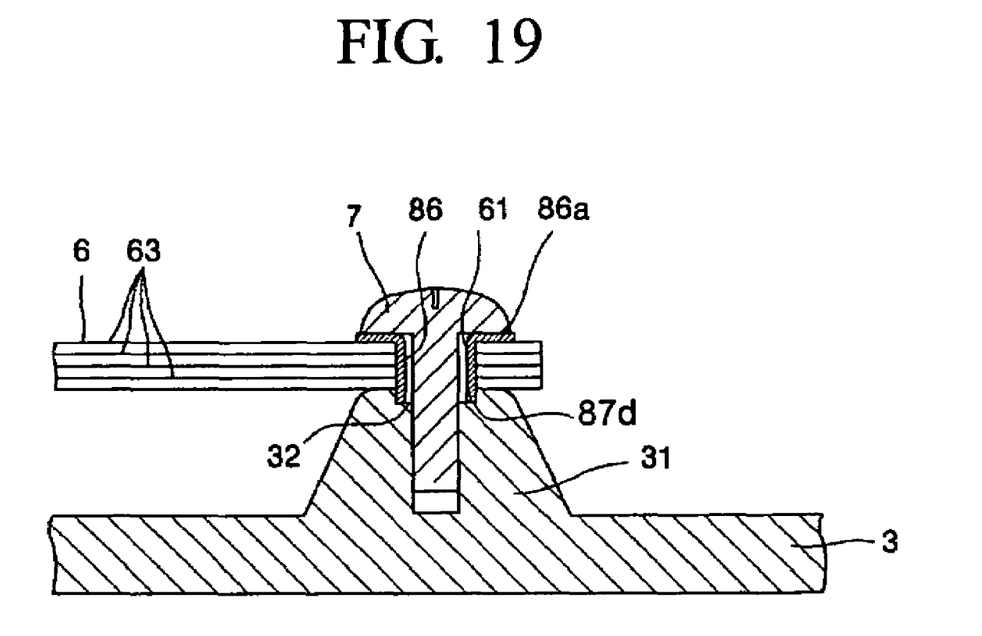

Further, an embodiment of the invention in FIG. 19, as compared to the embodiment shown in FIG. 14, shows a guide unit 87d can be formed by extending an end portion of the conductive tube 86, which faces the boss unit 31, and inserting the guide unit 87d into the coupling recess 32 of the boss unit 31.

The structures of the guide unit and the coupling recess can be applied to all embodiments of the present invention. The conductive member can be fixedly coupled to the boss unit due to the guide unit and the coupling recess, and the coupling position of the conductive member can be set accurately.

According to the plasma display device of the present invention, the grounding area of the circuit board can be increased by adopting the conductive member, thus the current and voltage noises or erroneous operations caused by the ground defects can be prevented.

In addition, the connecting structure between the circuit board and the chassis base can be formed fixedly. Since the distortion of the circuit board due to pressure by the bolt member can be prevented, and the bolt member will not accidentally loosen.

In addition, the mounting position of the circuit board can be known easily.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A plasma display device comprising:
    a plasma display panel having a display area, on which images are displayed;
    a chassis base coupled to a back surface of the plasma display panel;
    at least one circuit board on which at least one electronic element for driving the plasma display panel is mounted, said circuit board including a conductive portion and at least one coupling hole through which a bolt member passes to enable the circuit board to be coupled to the chassis base; and
    at least one conductive member for grounding said circuit board, a portion of said conductive member being inserted into said coupling hole, said conductive member having contact with the conductive portion of said circuit board and having contact with the bolt member.

2. The plasma display device of claim 1, wherein the conductive member includes a grounding portion that is inserted into the circuit board in a thickness direction of the circuit board and having contact with the conductive portion of said circuit board, and a supporting portion surrounding the coupling hole.

3. The plasma display device of claim 1, wherein the conductive member includes a first conductive member that is coupled to an upper surface of the circuit board, and a second conductive member that is coupled to a lower surface of the circuit board.

4. The plasma display device of claim 3, wherein the first conductive member and the second conductive member are connected to each other.

5. The plasma display panel of claim 4, wherein a penetration portion that is formed to contact an inner surface of the coupling hole is disposed on at least one of the first conductive member and the second conductive member.

6. The plasma display device of claim 3, wherein the first and second conductive members respectively include a first grounding portion and a second grounding portion that are inserted into the circuit board in a thickness direction of the circuit board, and respectively include a first supporting portion and a second supporting portion that surround the coupling hole.

7. The plasma display device of claim 1, wherein the conductive member is formed as a conductive tube, an outer surface of which contacts an inner surface of the coupling hole.

8. The plasma display device of claim 7, wherein the conductive tube includes a first flange portion on a portion that contacts a head of the bolt member.

9. The plasma display device of claim 8, wherein the conductive tube includes a second flange portion on a portion that contacts the chassis base.

10. The plasma display device of claim 1, wherein the circuit board has at least two layers, and the conductive portion is disposed on each layer of the circuit board.

11. The plasma display device of claim 1, wherein the chassis base includes a boss unit of protrusion type on a portion corresponding to the coupling hole, and the bolt member is coupled to the boss unit.

12. A coupling and grounding structure of a circuit board in a plasma display device having a plasma display panel on which images are displayed, a chassis base coupled to a back surface of the plasma display panel, and at least one circuit board on which at least one electronic element for driving the plasma display panel is mounted, the circuit board including a conductive portion and at least one coupling hole used to couple the circuit board to the chassis base, the coupling and grounding structure comprising:
    a bolt member penetrating the coupling hole of said circuit board and said chassis; and
    at least one conductive member that contacts the conductive portion of said circuit board and contacts a head of the bolt member, said conductive member having a guide unit inserted into a recess portion of the chassis base.

13. The coupling and grounding structure of claim 12, wherein the conductive member includes a grounding portion that is inserted into the circuit board in a thickness direction of the circuit board and having contact with the conductive portion of said circuit board, and a supporting portion surrounding the coupling hole.

14. The coupling and grounding structure of claim 12, wherein the conductive member includes a first conductive member that is coupled to an upper surface of the circuit board, and a second conductive member that is coupled to a lower surface of the circuit board, the guide unit extending from the second conductive member.

15. The coupling and grounding structure of claim 14, wherein the first conductive member and the second conductive member are connected to each other.

16. The coupling and grounding structure of claim 15, wherein a penetration portion that is formed to contact an inner surface of the coupling hole is disposed on at least one of the first conductive member and the second conductive member.

17. The coupling and grounding structure of claim 14, wherein the first and second conductive members respectively include a first grounding portion and a second grounding portion that are inserted into the circuit board in a thickness direction of the circuit board, and respectively include a first supporting portion and a second supporting portion that surround the coupling hole, the guide unit extending from the second supporting portion.

18. The coupling and grounding structure of claim 12, wherein the conductive member is formed as a conductive tube, an outer surface of which contacts an inner surface of the coupling hole, the guide unit extending from an end portion of the conductive tube.

19. The coupling and grounding structure of claim 18, wherein the conductive tube includes a first flange portion on a portion that contacts the head of the bolt member.

20. The coupling and grounding structure of claim 12, wherein the circuit board has at least two layers, and the conductive portion is disposed on each layer of the circuit board.

21. The coupling and grounding structure of claim 12, wherein the chassis base includes a boss unit of protrusion type on a portion corresponding to the coupling hole, the bolt member being coupled to the boss unit, and the recess portion is disposed in an upper end portion of the boss unit.

* * * * *